(12) United States Patent
Lin

(10) Patent No.: US 7,749,784 B2
(45) Date of Patent: Jul. 6, 2010

(54) FABRICATING METHOD OF SINGLE ELECTRON TRANSISTOR (SET) BY EMPLOYING NANO-LITHOGRAPHICAL TECHNOLOGY IN THE SEMICONDUCTOR PROCESS

(76) Inventor: Ming-Nung Lin, No. 2, Siamen St., Pingtung City, Pingtung County (TW) 900

( * ) Notice: Subject to any disclaimer, the term of this patent is extended or adjusted under 35 U.S.C. 154(b) by 770 days.

(21) Appl. No.: 11/646,383

(22) Filed: Dec. 28, 2006

(65) Prior Publication Data

US 2007/0212836 A1 Sep. 13, 2007

Related U.S. Application Data

(60) Provisional application No. 60/754,614, filed on Dec. 30, 2005.

(51) Int. Cl.
*H01L 21/00* (2006.01)
(52) U.S. Cl. .................. 438/34; 438/197; 438/674; 438/962; 977/762; 977/771; 977/774; 977/938; 257/E21.398; 257/E21.582; 257/E21.09
(58) Field of Classification Search .................. 438/34, 438/197, 264, 674, 962; 257/E21.398, E21.582, 257/E21.09; 977/762, 771, 774, 938
See application file for complete search history.

(56) References Cited

U.S. PATENT DOCUMENTS

| | | | | |
|---|---|---|---|---|
| 6,268,273 | B1 * | 7/2001 | Kim et al. | 438/594 |
| 6,515,339 | B2 * | 2/2003 | Shin et al. | 257/368 |
| 7,105,874 | B2 * | 9/2006 | Chae et al. | 257/213 |
| 2006/0275778 | A1 * | 12/2006 | Wu et al. | 435/6 |
| 2006/0275779 | A1 * | 12/2006 | Li et al. | 435/6 |
| 2008/0260941 | A1 * | 10/2008 | Jin | 427/126.4 |

* cited by examiner

*Primary Examiner*—Michelle Estrada
(74) *Attorney, Agent, or Firm*—Bacon & Thomas, PLLC

(57) ABSTRACT

A fabricating method of Single Electron Transistor includes processing steps as follows: first, deposit the sealing material of gas molecule or atom state on the top-opening of the nano cylindrical pore, which having formed on the substrate, so that the diameter of said top-opening gradually reduce to become a reduced nano-aperture, whose opening diameter is smaller than that of said top-opening; then, keep the substrate in horizontal direction and tilt or rotate said substrate into tilt angle or rotation angle in coordination with tilt angle with the reduced nano-aperture as center respectively, and pass the deposit material of gas molecular or atom state through the reduced nano-aperture respectively. Thereby a Single Electron Transistor including island electrode, drain electrode, source electrode and gate electrode of nano-quantum dot with nano-scale is directly fabricated on the surface of said substrate.

8 Claims, 22 Drawing Sheets

FABRICATING METHOD OF SINGLE ELECTRON TRANSISTOR (SET) BY EMPLOYING NANO-LITHOGRAPHICAL TECHNOLOGY IN THE SEMICONDUCTOR PROCESS

This application claims the benefit of provisional U.S. patent application Ser. No. 754,614, filed Dec. 30, 2005.

FIELD OF THE PRESENT INVENTION

The present invention relates to the fabricating Single Electron Transistor (SET) in nano scale, particularly refers to the fabricating method of SET by employing nano-lithography and etching technology in the semiconductor process with breakthrough of physical limit in the existing facility for fabricating nano-structure so that not only the nano structural SET can be precisely fabricated out but also all the relative position and size, of each nano quantum dot in island electrode, drain electrode, source electrode and gate electrode can be precisely controlled and fabricated under process of room temperature so as to achieve the cost-effective purpose in mass production.

BACKGROUND OF THE PRESENT INVENTION

The nano-electronic technology is reckoned as the micro-electronic technological core of future new era as it mainly has working current of the nano-electronic component with quantum effect is in the range of several to several tens of electron such that its energy consumption in working operation being very low; Comparing with current micro-electronic component in the semiconductor, not only its energy consumption can be substantially reduced but also the pulse frequency (namely operation speed) is relatively enhanced; Wherein, Single Electron Transistor (SET) is considered as the potential core in the next generation of microprocessor, of which the main operational basis is on the physical effect of Coulomb Blockade Effect and Single Electron Tunnel Effect.

In the middle age of the $20^{th}$ century, both of the physical effect of Coulomb Blockade Effect and Single Electron Tunnel Effect were already theoretically expected, and the Coulomb Blockade Effect was one of important physical phenomena observed by the solid physics in 1980; When a physical system reduced to reach the nano scale, the charging and discharging process in such system will becomes discrete, namely quantumized. The Charging Energy (Ec) for charging an electron is $[e^2/2C]$, where, e is the electric charge of an electron, C is electric capacitance of such physical system; If the smaller is the C, then the greater is the Ec, hence it being called Coulomb Blockade Energy; Under such circumstance of the system, the charging and discharging electron can merely transmitted in one by one electron manner instead of collective group manner; the feature of single electron transmission in individual manner for the nano-scale system is called Coulomb Blockade Effect. Besides, if two quantum points are connected by a "Tunnel Junction" with a "Tunnel Barrier" in between, then a single electron passes from one quantum point through the Tunnel Barrier and reaches the other quantum point is called "Quantum Tunneling Effect". In order to enable an electron tunnel from one quantum point through the Tunnel Barrier and reach the other quantum point, the energy of that electron (eV) must overcome the (Ec) of that electron, namely (eV)>(e/2C), where, C is the electric capacitance of the Tunnel Junction between both of the quantum points. Up to the 80 years of the post $20^{th}$ century, people can then successfully fulfill the utilization these effects in the circuit of electronic component under super low temperature; that is later than the theory of which for over several decades; the reason is that the human technology is neither mature enough to form a very tiny electrode nor to precisely position those electrodes. The direct application of the Coulomb Blockade Effect and Single Electron Tunnel Effect is the design and fabrication of the Single Electron Transistor (SET). The characteristic advantage of the SET component is low energy consumption, high temperature sensitivity and easiness of integration so that it is reckoned as one of the most promising new nano components after the micro electronic components.

Please refer to FIG. 1, the fundamental circuit diagram of the Single Electron Transistor (SET), which had been already published, is a triode of source electrode S, drain electrode D and gate electrode G as well as an island electrode I, which locating between said source electrode S and drain electrode D; For said island electrode I, its electric capacitance is very small and its size is in nano scale relatively and further has Coulomb Blockade Effect of quantum dot QD and Tunnel Junctions at both ends of which; The characteristic of that structure is on the discrete energy level inside of the quantum point so that the electron can only tunnel from the source electrode S quantum point to the drain electrode D quantum point under the condition of lining up the Fermi level of the source electrode S quantum point and the drain electrode D quantum point with the energy level in the quantum point; Thereby, the tunneling electron number for each time can be controlled even up to optimal manner of only one single electron tunneling through each time; Hence, the total performance and yield of the SET is effected by the d1, d2 and d3 as well as size of itself, where, d1 is the distance between the source electrode S and the island electrode I, d2 is the distance between the drain electrode D and the island electrode I, and d3 is the distance between the gate electrode G and the island electrode I; For current technology level, it is hard to achieve foregoing requirements; The high fabricating cost other than the technical difficulty aforesaid is the primal reason that SET is still not adopted in mass production by semiconductor and electronics industries.

As further shown in FIG. 2 through FIG. 4, the nano-structure is produced from conventional nano-lithography. The fabricating steps are as below: (A): First layout the expected nano pattern Q on the photomask M, then put said photomask M on the top surface of the substrate 1, which being spread with photo-resist 2 (as shown in the FIG. 2); (B): Pass light beam e through said nano pattern Q on said photomask M so as to have same pattern as said nano pattern Q on said photo-resist 2, which spreads on said substrate 1, by exposure and development to define the nano-aperture 3 structure (as shown in the FIG. 3); (C): By means of deposit source device 30, directly deposit deposit material B of gas molecule or atom state on the surroundings and bottom of said nano-aperture 3 (as shown in view X and view Y of the FIG. 4); And (D): Finally, selectively remove said photo-resist 2 by solution, thereby forming a nano quantum dot 4 structure on the surface of said substrate 1 (as shown in view Z of the FIG. 4). Wherein, the conventional process aforesaid being confined to the precision limit of the existing photolithography such that the current best precise nano-scale can only reach 60~65 nm; Hence, the nano-scale of said nano-aperture 3 from photomask M of pattern transferring photolithography is over 60 nm; Thereby, the nano-scale of said nano quantum dot 4 fabricated from these equipment is also over 60 nm relatively; Thus, the physical size limit of said conventional nano-devices of nano-structure is still in the range of over 60 nm; Therefore, how to breakthrough this bottleneck such that making the nano-scale of nano-aperture 3 be smaller becomes the impending crucial technical tough question of all experts in various fields; The solution being subject to the industrial practical feasibility in mass production and cost-effective economical principle so that the choice of means in technical breakthrough becomes more difficult; The scientists who understand the nano-science and the experts who familiarize with nano-technology are all aware of the benefits of working out the devices being smaller than 10 nm or even 1~2 nm, but none of better solution or effective technical breakthrough is proposed, announced or applied.

SUMMARY OF THE PRESENT INVENTION

The present invention originates a fabricating method of Single Electron Transistor (SET) by employing nano-lithographical technology in the semiconductor process with main object is to make use of existing facility of the semiconductor process without any change and alternation or revised design in the accuracy and precision of equipments so that not only the nano structural SET can be precisely fabricated out but also all the relative position, size, constituent and the density of each nano quantum dot in island electrode I, drain electrode D, source electrode S and gate electrode G can be precisely controlled and fabricated under process of room temperature in compatible manner with current existing nano-lithography so as to achieve the cost-effective in mass production.

The other object of the present invention is to provide a fabricating method of Single Electron Transistor (SET) by employing nano-lithographical technology in the semiconductor process with processing steps comprising: (a) First deposit the sealing material of gas molecule or atom state on the top-opening of the nano cylindrical pore, which having formed on the substrate, so that the diameter of said top-opening gradually reduce to become a reduced nano-aperture, whose opening diameter is smaller than that of said top-opening; (b) Keep said substrate in horizontal direction, and align the deposit material of gas molecular or atom state to face perpendicularly towards the reduced nano-aperture so that the island electrode nano quantum dot with same diameter as that of reduced nano-aperture is directly deposited n at the expected position on the surface of said substrate of the nano cylindrical pore by means of said deposit material passing through said reduced nano-aperture; (c) Keep the output of the deposit material of gas molecular or atom state in the same direction as before, tilt said substrate rightwards into tilt angle with the reduced nano-aperture as center, the drain electrode nano quantum dot is deposited at the expected right position of said existing island electrode on the surface of said substrate by the deposit material passing through said reduced nano-aperture again; (d) Keep the output of the deposit material of gas molecular or atom state in the same direction as before, tilt said substrate leftwards into tilt angle with the reduced nano-aperture as center, the source electrode nano quantum dot is deposited at the expected left position of said existing island electrode on the surface of said substrate by the deposit material passing through said reduced nano-aperture again; (e) Keep the output of the deposit material of gas molecular or atom state in the same direction as before, rotate said substrate clockwise into rotation angle in coordination with tilt angle θ with said reduced nano-aperture as central axis, the gate electrode nano quantum dot is deposited at the expected front position of said existing island electrode on the surface of said substrate by the deposit material passing through said reduced nano-aperture again; and (f) Finally, By means of solution rinsing (i.e. wet etching) or gas etching (i.e. dry etching), remove said nano cylindrical pore in said photoresist on said substrate, thereby a SET (Single Electron Transistor) including island electrode nano quantum dot, drain electrode nano quantum dot, source electrode nano quantum dot and gate electrode nano quantum dot with nano-scale is directly fabricated on the surface of said substrate.

DETAILED DESCRIPTION OF THE PREFERRED EMBODIMENT

Figure 1:
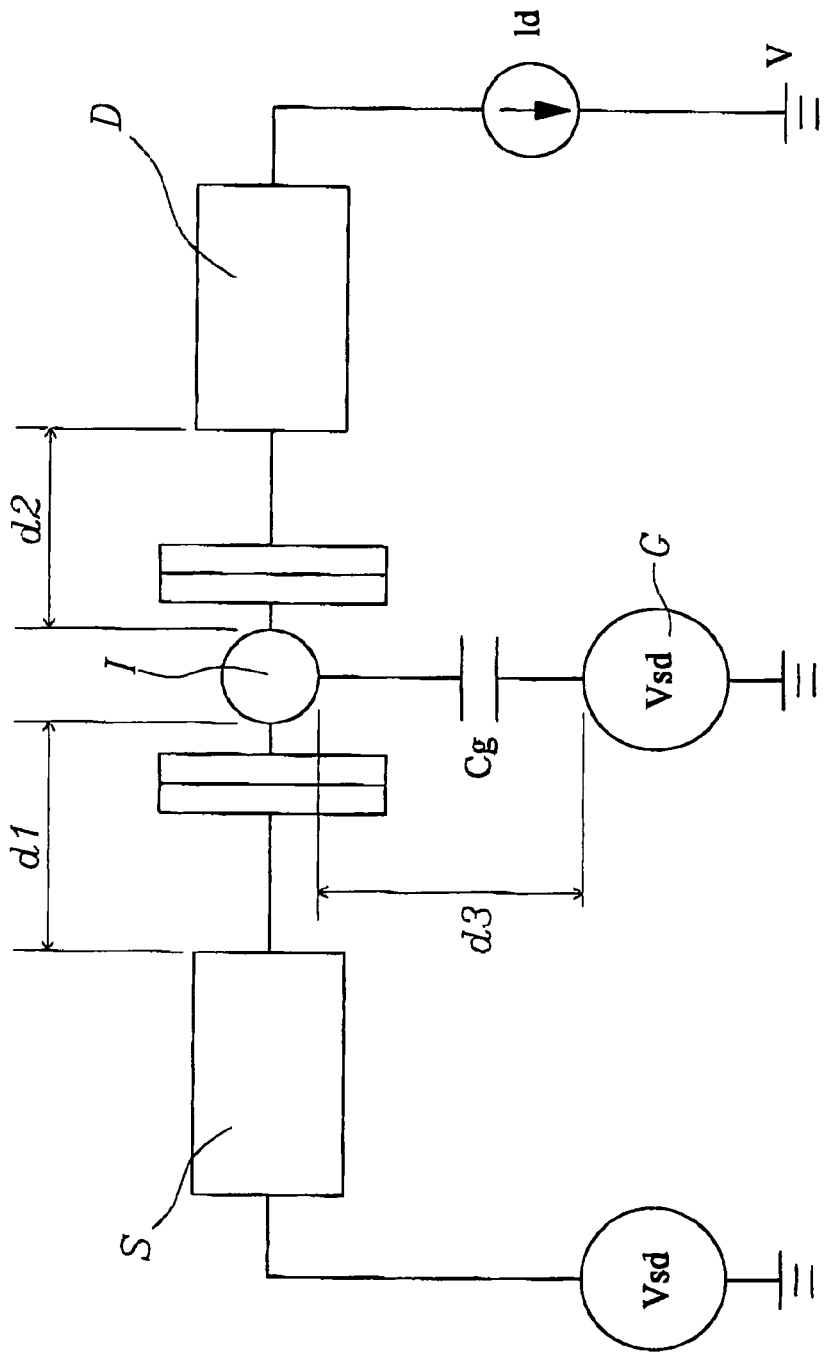
FIG. 1 is the fundamental circuit diagram of the Single Electron Transistor (SET).
Figure 2:
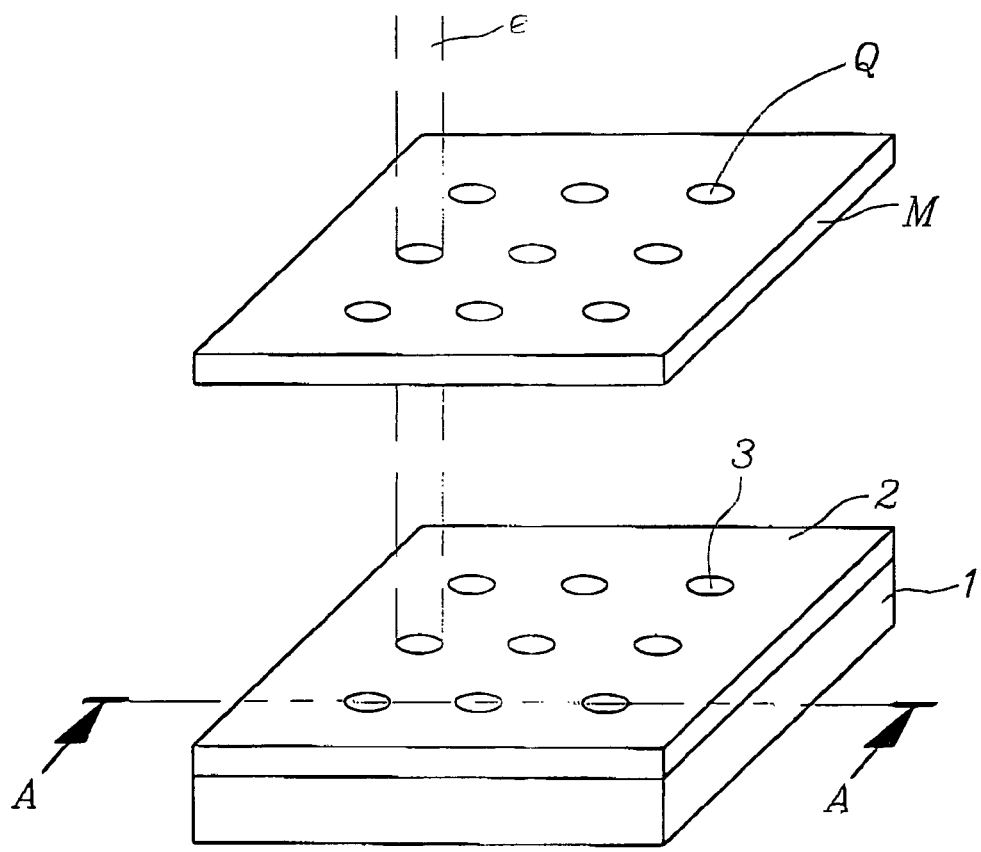
FIG. 2 is the perspective illustrative view showing the photo-mask and substrate according to conventional pattern transferring photolithography of nano-lithography process.
Figure 3:
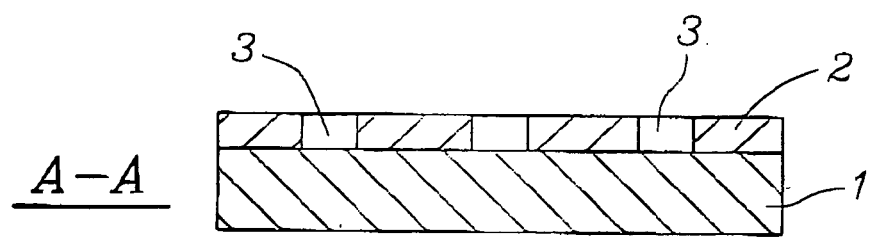
FIG. 3 is the cross sectional view taken on the line A-A of FIG. 2.
Figure 4:
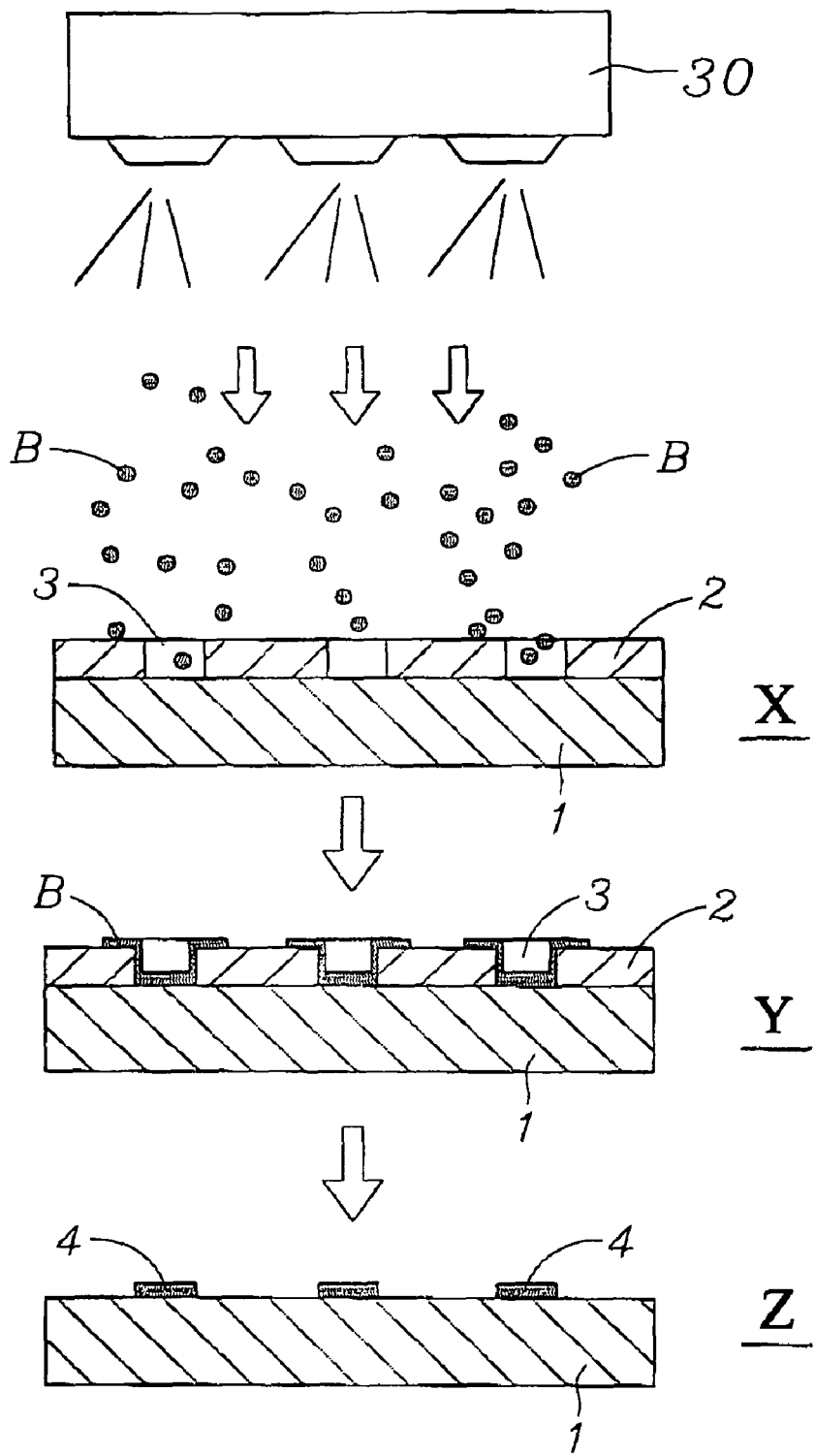
FIG. 4 is the illustrative flow chart showing the fabrication of nano-quantum-dot structure according to nano-lithography in the conventional semiconductor process.
Figure 5:
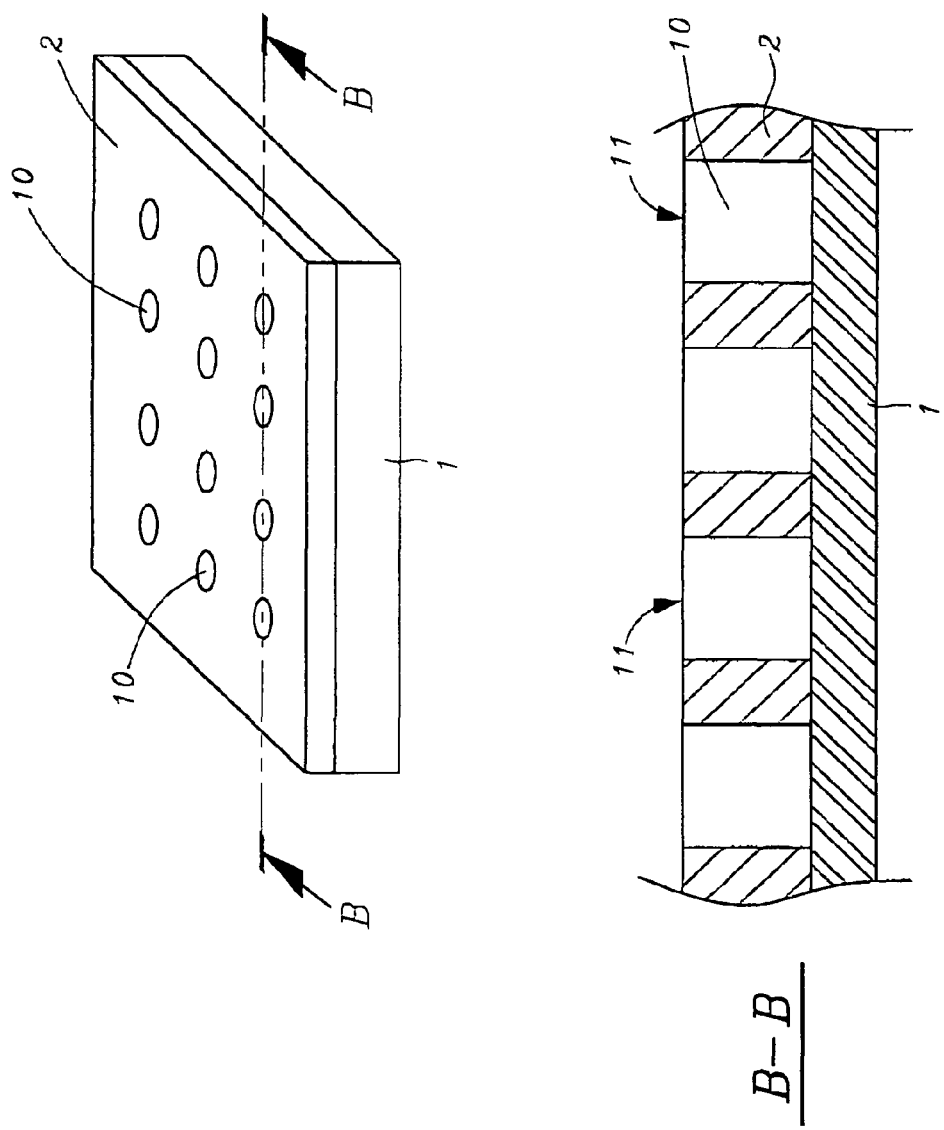
FIG. 5 is the perspective illustrative view showing the formation of nano-cylindrical-pore according to nano-lithography in the conventional semiconductor process.

Please refer to FIG. 5, the existing nano cylindrical pore 10 is fabricated from conventional process in accordance with the build-up or build-down method; The minimum size of said conventional nano cylindrical pore 10 is 60 nm or 60 nm over; The alternative fabricating process can be anyone of the photolithography, nano-imprinting, Molecular Beam Epitaxy (MBE), and Metal-Organic Vapor phase Chemical Deposition in Epitaxy (MOVCD) to achieved the implement; However, the ways of these conventional technologies aforesaid are not to be detailed described here as their feature and know-how being not aspired after or sought for by the present invention.

Figure 9:
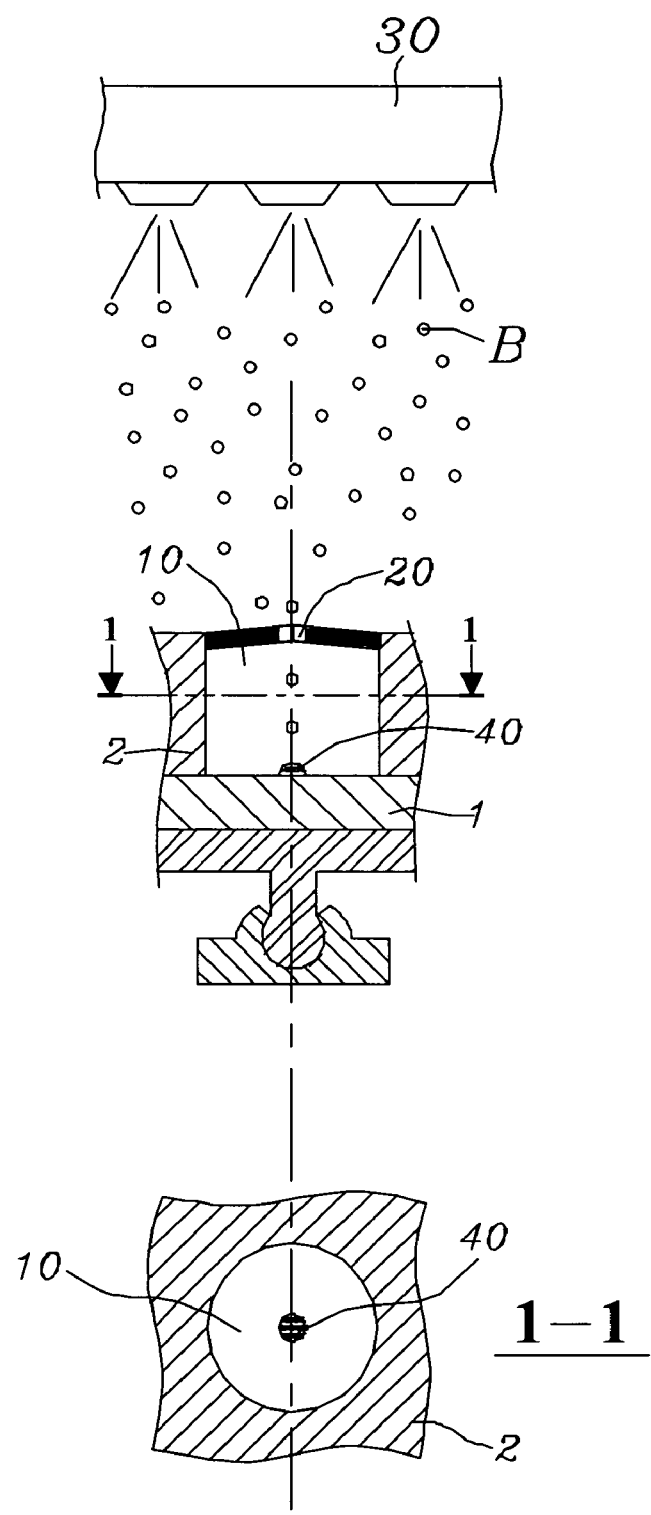
FIG. 9 is the illustrative flow chart showing the fabrication of nano-quantum-dot for the source electrode of the SET on the surface of the substrate according to the present invention.
Figure 10:
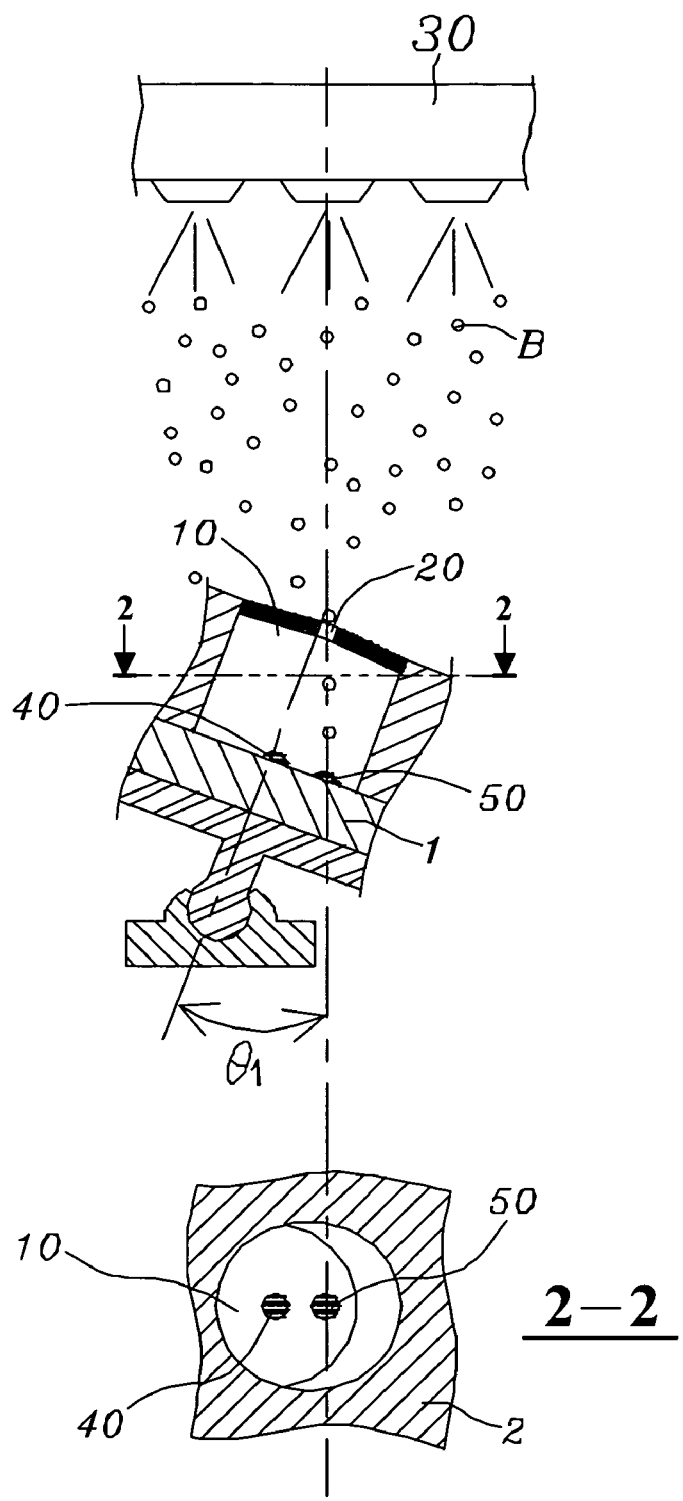
FIG. 10 is the illustrative flow chart showing the fabrication of nano-quantum-dot for the drain electrode of the SET on the surface of the substrate according to the present invention.
Figure 11:
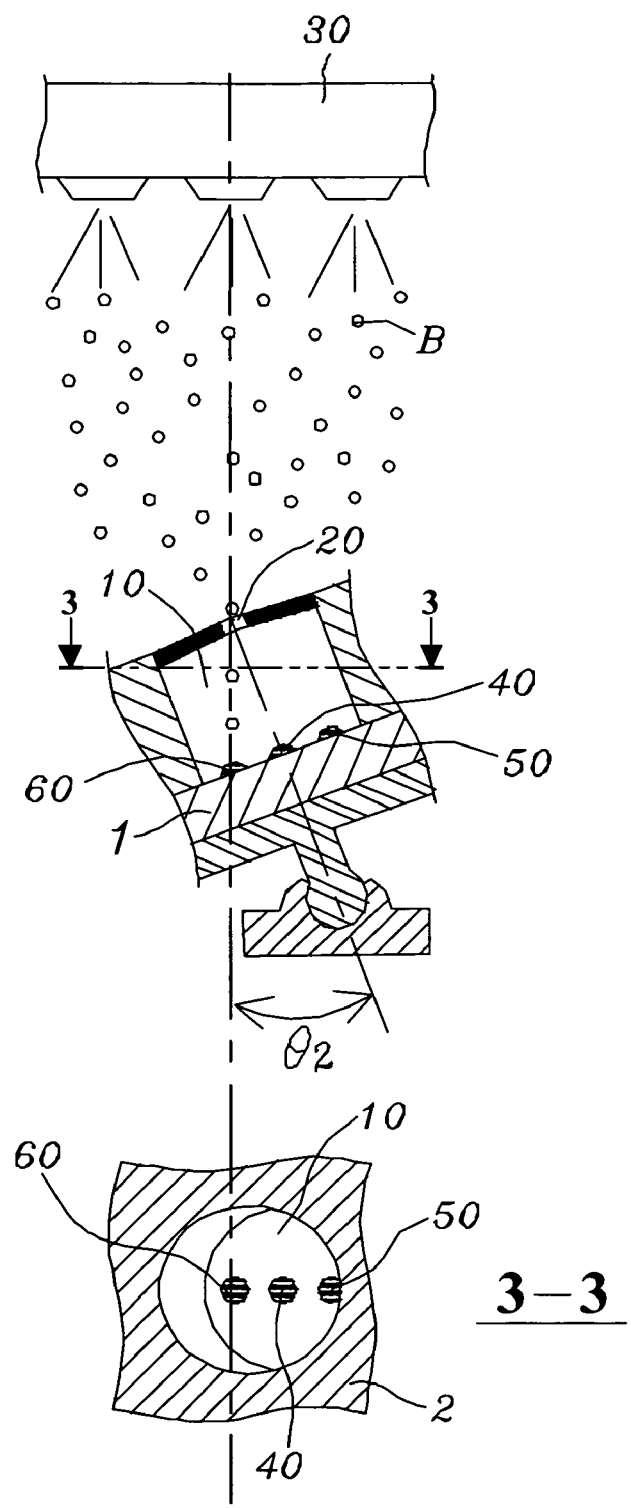
FIG. 11 is the illustrative flow chart showing the fabrication of nano-quantum-dot for the island electrode of the SET on the surface of the substrate according to the present invention.
Figure 12:
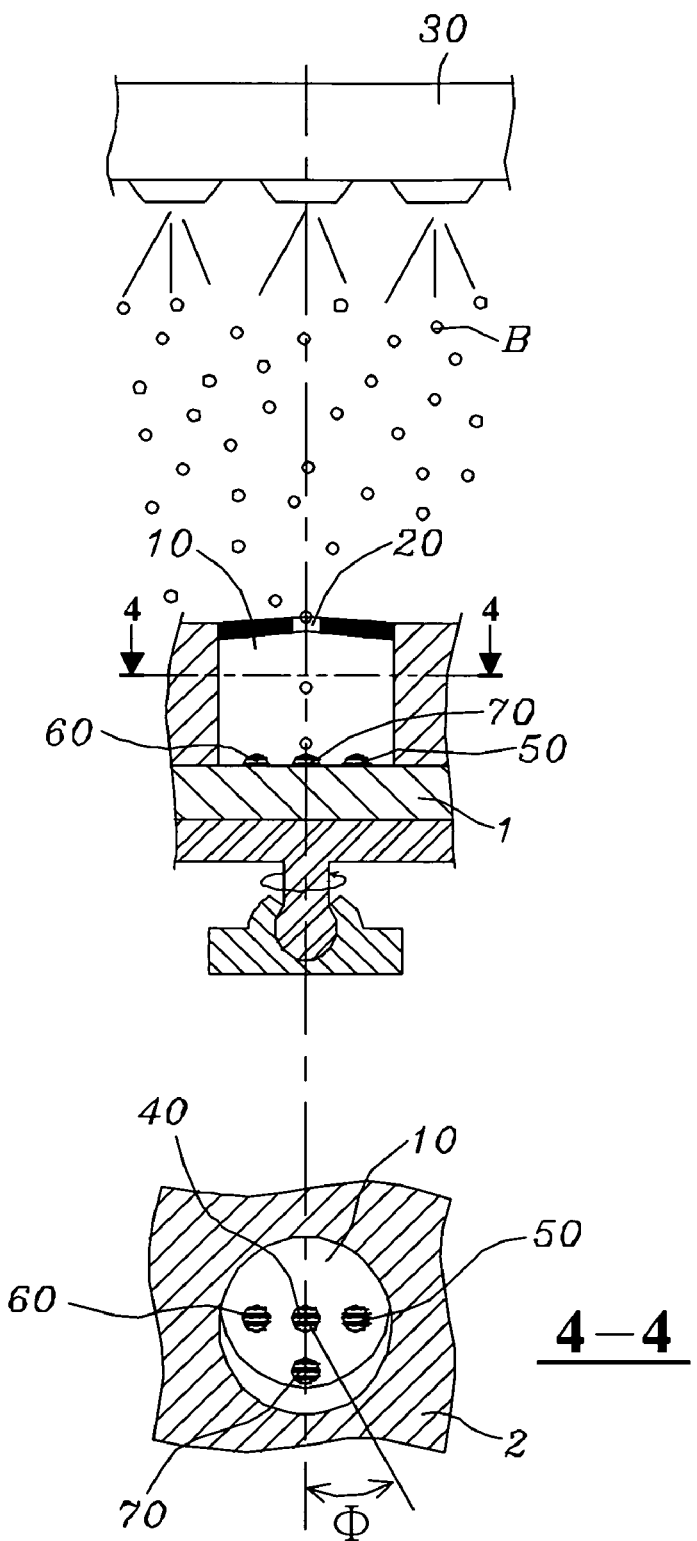
FIG. 12 is the illustrative flow chart showing the fabrication of nano-quantum-dot for the gate electrode of the SET on the surface of the substrate according to the present invention.
Figure 13:
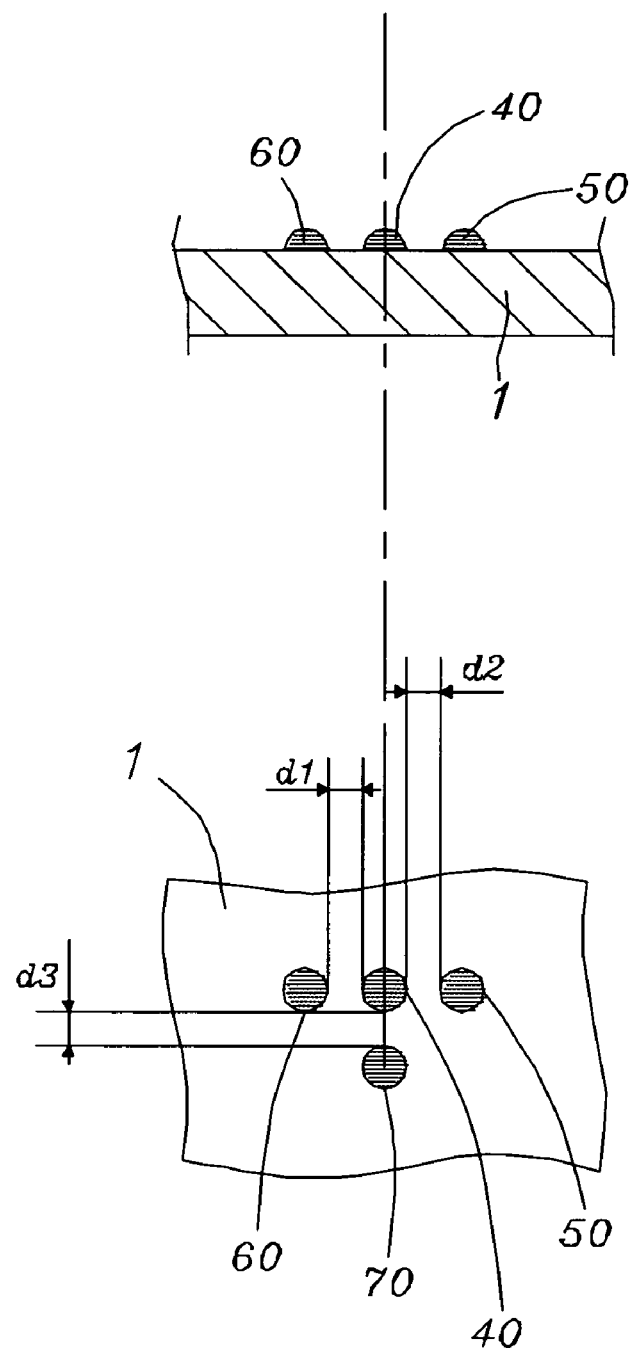
FIG. 13 is the illustrative view showing the completion of all the nano-quantum-dots for fabrication of the SET on the surface of the substrate according to the present invention.

Please refer to FIG. 5 through FIG. 13, the process steps of the fabricating method of Single Electron Transistor (SET) by employing nano-lithographical technology in the semiconductor process in the present invention comprise:

(a): First deposit the sealant, sealing material A of gas molecule or atom state on the top-opening 11 of the nano cylindrical pore 10, which having formed on the photo-resist 2 of the substrate 1 (as shown in view B-B of the FIG. 5), so that the diameter of said top-opening 11 gradually reduce to become a reduced nano-aperture 20, whose opening diameter is smaller than that of said top-opening 11 (as shown in view g of the FIG. 6 and FIG. 7);

(b) Keep said substrate 1 in horizontal direction, and align the deposit material B of gas molecular or atom state to face perpendicularly towards the reduced nano-aperture 20 so that the island electrode I nano quantum dot 40 with same diameter as that of reduced nano-aperture 20 is directly deposited n at the expected position on the surface of said substrate 1 of the nano cylindrical pore 10 by means of said deposit material B passing through said reduced nano-aperture 20 (as shown in the FIG. 9);

(c) Keep the output of the deposit material B of gas molecular or atom state in the same direction as before, tilt said substrate 1 rightwards into tilt angle θ1 with the reduced nano-aperture 20 as center, the drain electrode D nano quantum dot 50 is deposited at the expected right position of said existing island electrode I on the surface of said substrate 1 by the deposit material B passing through said reduced nano-aperture 20 again (as shown in the FIG. 10 and cross section view 2-2 of the FIG. 10);

(d) Keep the output of the deposit material B of gas molecular or atom state in the same direction as before, tilt said substrate 1 leftwards into tilt angle θ2 with the reduced nano-aperture 20 as center, the source electrode S nano quantum dot 60 is deposited at the expected left position of said existing island electrode I on the surface of said substrate 1 by the deposit material passing through said reduced nano-aperture 20 again (as shown in the FIG. 11 and cross section view 3-3 of the FIG. 11);

(e) Keep the output of the deposit material B of gas molecular or atom state in the same direction as before, rotate said substrate 1 clockwise into rotation angle Φ in coordination with tilt angle θ with said reduced nano-aperture 20 as central axis, the gate electrode G nano quantum dot 70 is deposited at the expected front position of said existing island electrode I on the surface of said substrate 1 by the deposit material B passing through said reduced nano-aperture 20 again (as shown in the FIG. 12 and cross section view 4-4 of the FIG. 12);

(f) Finally, By means of solution rinsing (i.e. wet etching) or gas etching (i.e. dry etching), remove said nano cylindrical pore 10 in said photo-resist 2 on said substrate 1, thereby a Single Electron Transistor (SET) including island electrode I nano quantum dot 40, drain electrode D nano quantum dot 50, source electrode S nano quantum dot 60 and gate electrode G nano quantum dot 70 with nano-scale is directly fabricated on the surface of said substrate 1 (as shown in the FIG. 13 and whose top-view).

Wherein, if said tilt angle θ1 in step (c) equals tilt angle θ2 in step (d), then the distance d2 will equal d1 (as shown in the FIG. 13); Besides, d3 is controlled by the magnitude of said rotation angle Φ (as shown in view 4-4 of the FIG. 12), Hence, by means of easily controllable positioning in the θ1, θ2 and Φ, then each of d1, d2 and d3 for source electrode S nano quantum dot 60, drain electrode D nano quantum dot 50 and gate electrode G nano quantum dot 70 between common island electrode I nano quantum dot 40 can be, together along with the density required per unit area, precisely achieved; Where, d1 is the distance between said source electrode S nano quantum dot 60 and said island electrode I nano quantum dot 40, d2 is the distance between said drain electrode D nano quantum dot 50 and said island electrode I nano quantum dot 40, d3 is the distance between said gate electrode G nano quantum dot 70 and said island electrode I nano quantum dot 40, (as shown in the FIG. 13); Further, if each nano quantum dot is even required to have different material respectively such as semiconductor, metal and the like, they can be met by only selecting matched different deposit material B so that the present invention indeed has high total effect and low cost in consequence of not only applicable field and expansion is rather comprehensive but also all the process involved can be performed under the room temperature.

Moreover, the foregoing procedure of steps (b), (c), (d) and (e) are not mandatory in order sequence without flexibility; for example, if step (c) is taken as initial step to finish the drain electrode D nano quantum dot 50, then other island electrode I nano quantum dot 40, source electrode S nano quantum dot 60 and gate electrode G nano quantum dot 70 can also be subsequently finished with same result as foregoing procedure by appropriately control and adjust the each tilt angle θ and the rotation angle Φ.

Figure 6:
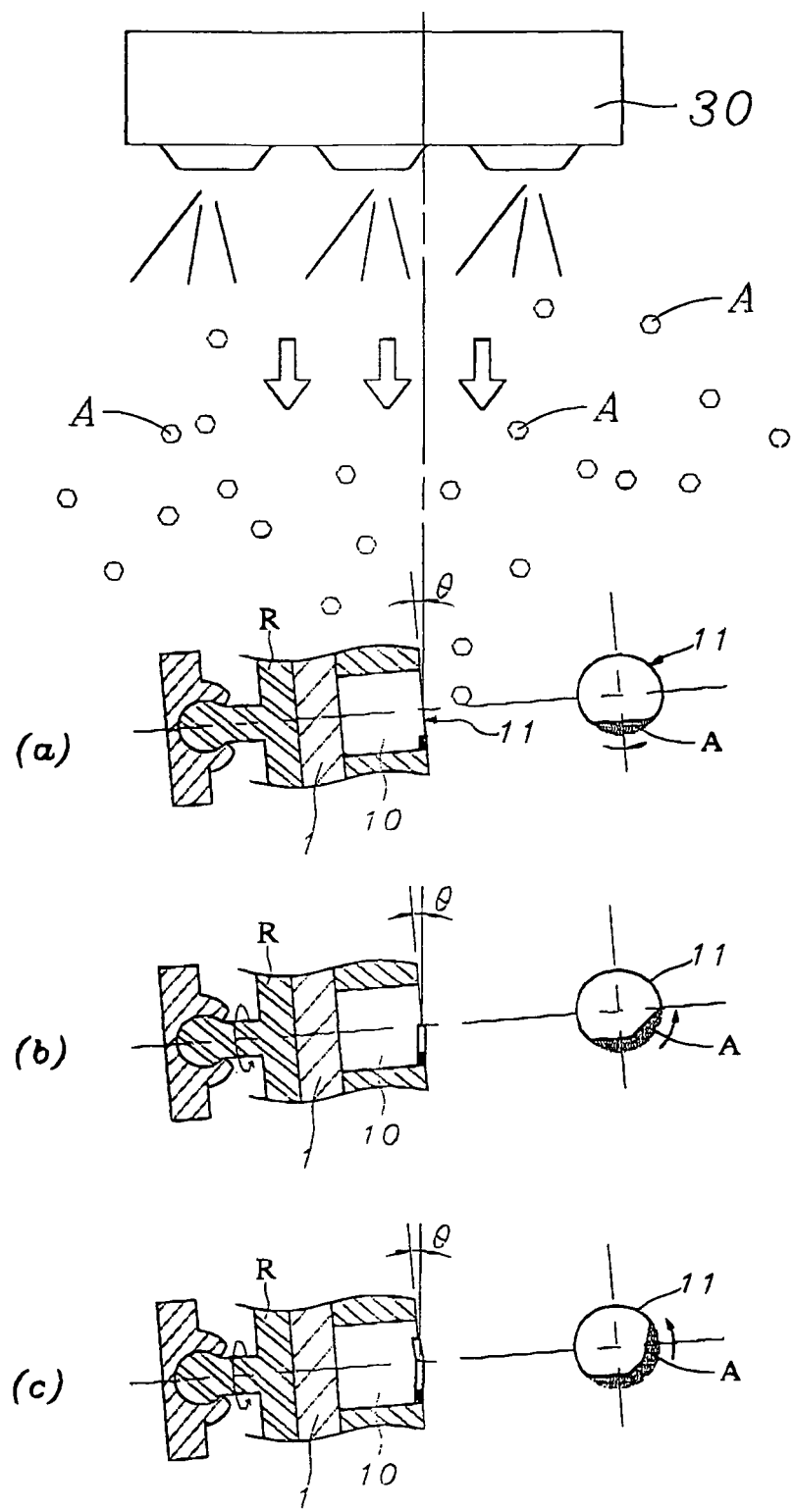
FIG. 6 is the illustrative flow chart showing the formation of reduced nano-aperture on the top of nano-cylindrical-pore according to the present invention.
Figure 6:
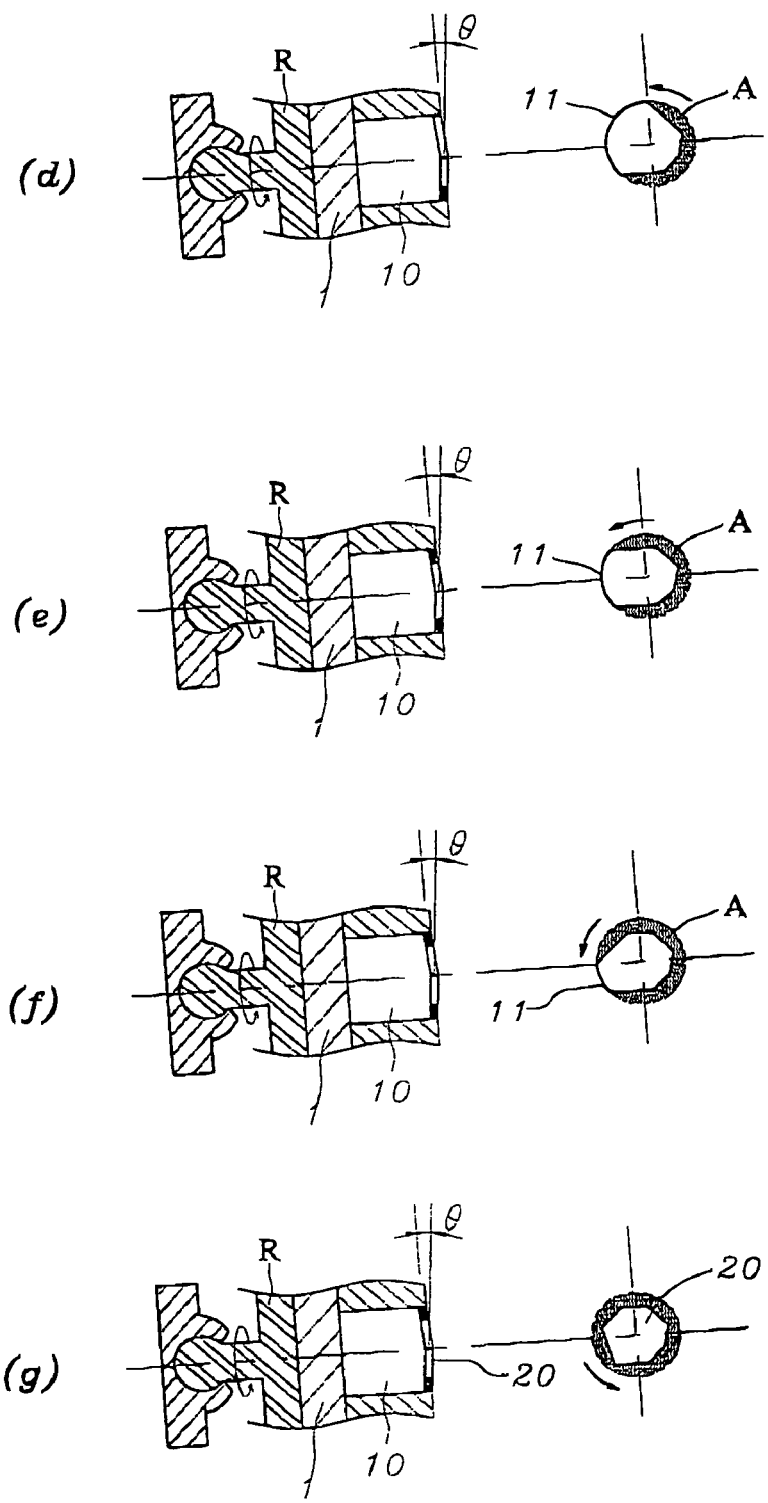
Figure 7:
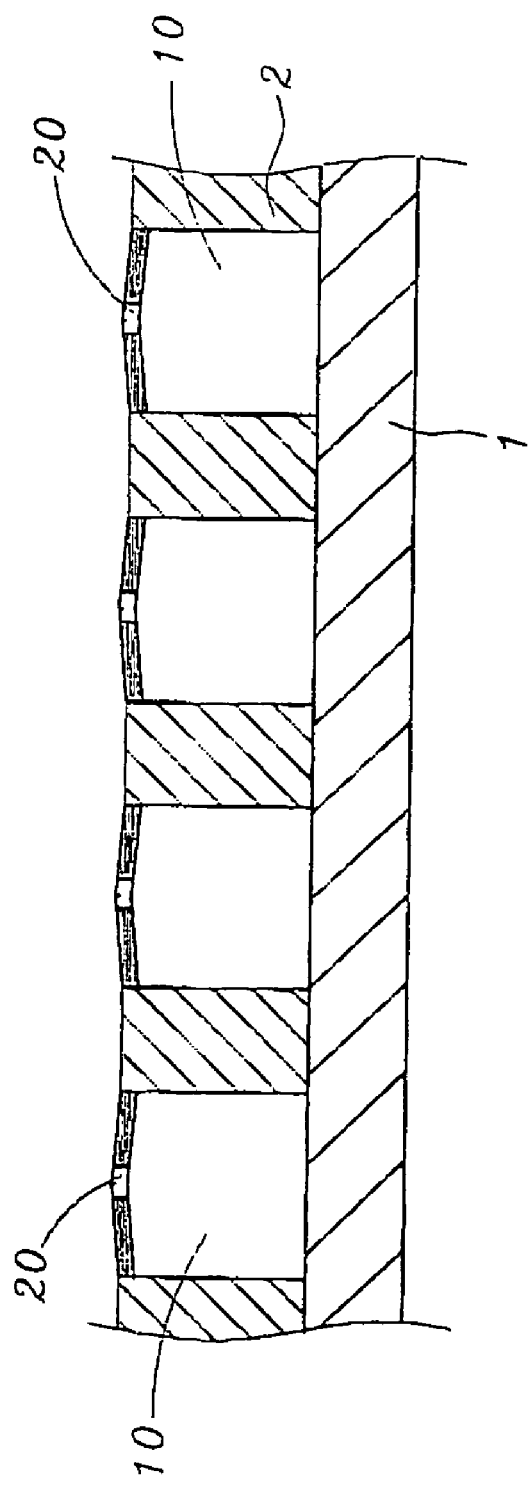
FIG. 7 is the cross sectional illustrative view showing the completion of reduced nano-aperture on the top of nano-cylindrical-pore according to the present invention.
Figure 8:
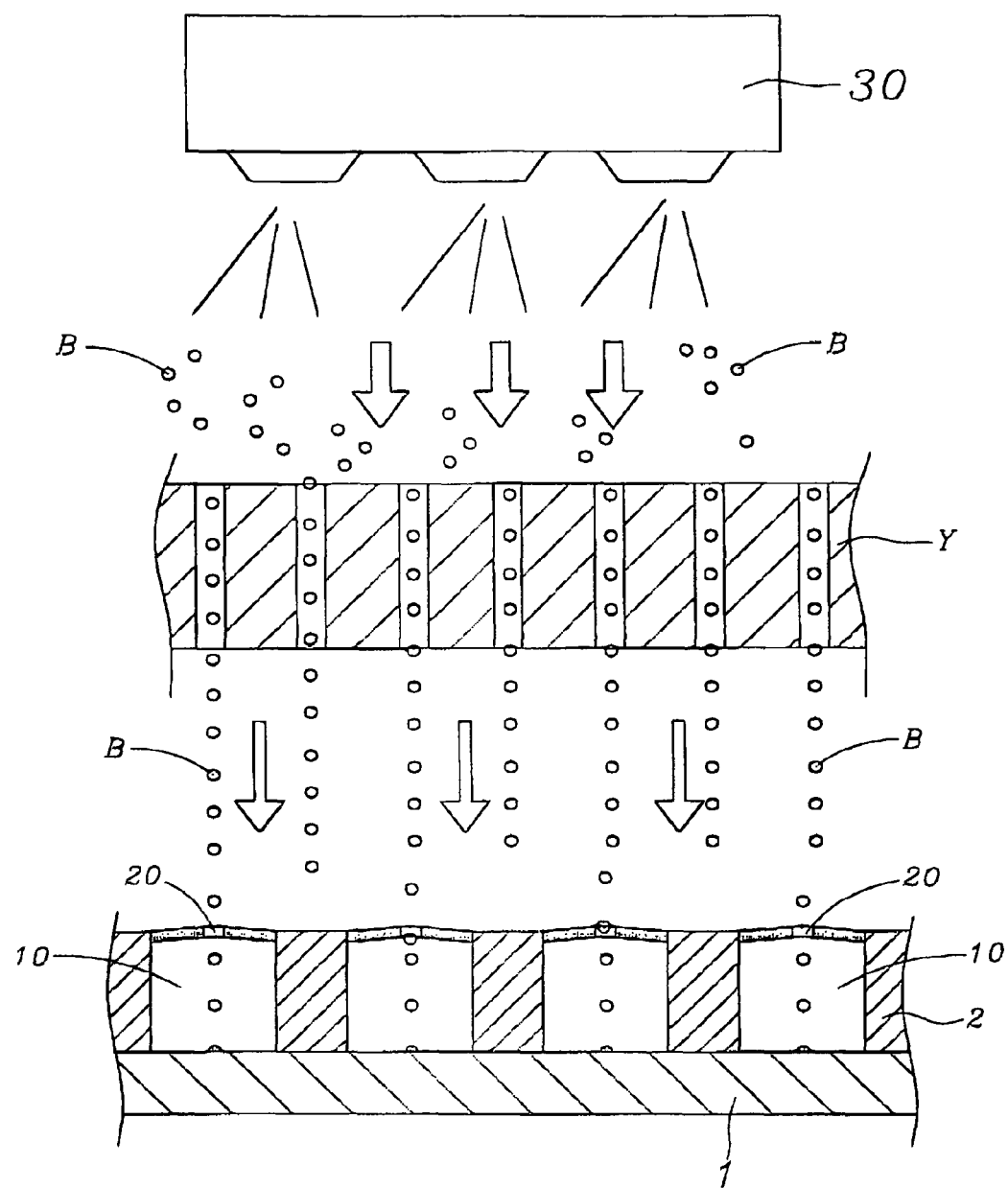
FIG. 8 is the operation illustrative view showing the formation of nano-quantum-dot for growing into SET on the surface of the substrate according to the present invention.

Additionally, the sub-steps of performing said step (a) aforesaid in forming the reduced nano-aperture 20 on the top-opening 11 of the nano cylindrical pore 10 comprise (as shown in FIG. 6):

(1): First firmly place said substrate 1 on the tilt-rotary console R with capability of 3-D tilt and rotation and adjust said tilt-rotary console R in tilt angle θ(as shown in view a of the FIG. 6), namely the included angle value of the central line of said top-opening 11 of said nano cylindrical pore 10 and the output direction of said deposit source device 40 is (90°-θ); so that said sealing material A of gas molecule or atom state can partially deposit on the end rim of said top-opening 11 of said nano cylindrical pore 10 (as shown in view a of FIG. 6 and corresponding view marked with A); and (2): Let said tilt-rotary console R keep in tilt angle θ inclination, and gradually rotate it one complete rotation (as respectively shown in view b, c, d, e, f and each of corresponding lateral views of the FIG. 6), thereby a reduced nano-aperture 20 with diameter being smaller than that of said top-opening 11 is formed on said top-opening 11 of said nano cylindrical pore 10 by deposition of said sealant, sealing material A of gas molecule or atom state (as shown in view g and corresponding lateral view of the FIG. 6).

In aforesaid sub-step (2), the rotational number of said tilt-rotary console R can be increased so as to get smaller orifice diameter in said reduced nano-aperture 20; Besides, the size of the orifice diameter in said reduced nano-aperture 20 can be real-time monitored by membrane thickness meter to serve as basis in control the rotational speed of said tilt-rotary console R; Thus, the expected subsequent nano-structure of said island electrode I nano quantum dot 40, drain electrode D nano quantum dot 50, source electrode S nano quantum dot 60 and gate electrode G nano quantum dot 70 in various specifications can be conformed in consequence of the expected size of the orifice diameter in said reduced nano-aperture 20 can be achieved in this way.

Furthermore, the output of said deposit material B of gas molecule or atom state in step (a) aforesaid is supplied by said deposit source device 30; In order to regulate said deposit material B of gas molecule or atom state to pass through said reduced nano-aperture 20 in manner of straight line path, a collimator Y can be installed between said deposit source device 30 and said reduced nano-aperture 20 (as shown in the FIG. 8) so that the moving direction of said deposit material B of gas molecule or atom state becomes more coherent; Thus, the reliability of said island electrode I (nano quantum dot 40, drain electrode D nano quantum dot 50, source electrode S nano quantum dot 60 and gate electrode G nano quantum dot 70 forming on the surface of said substrate 1 is enhanced.

Figure 14:
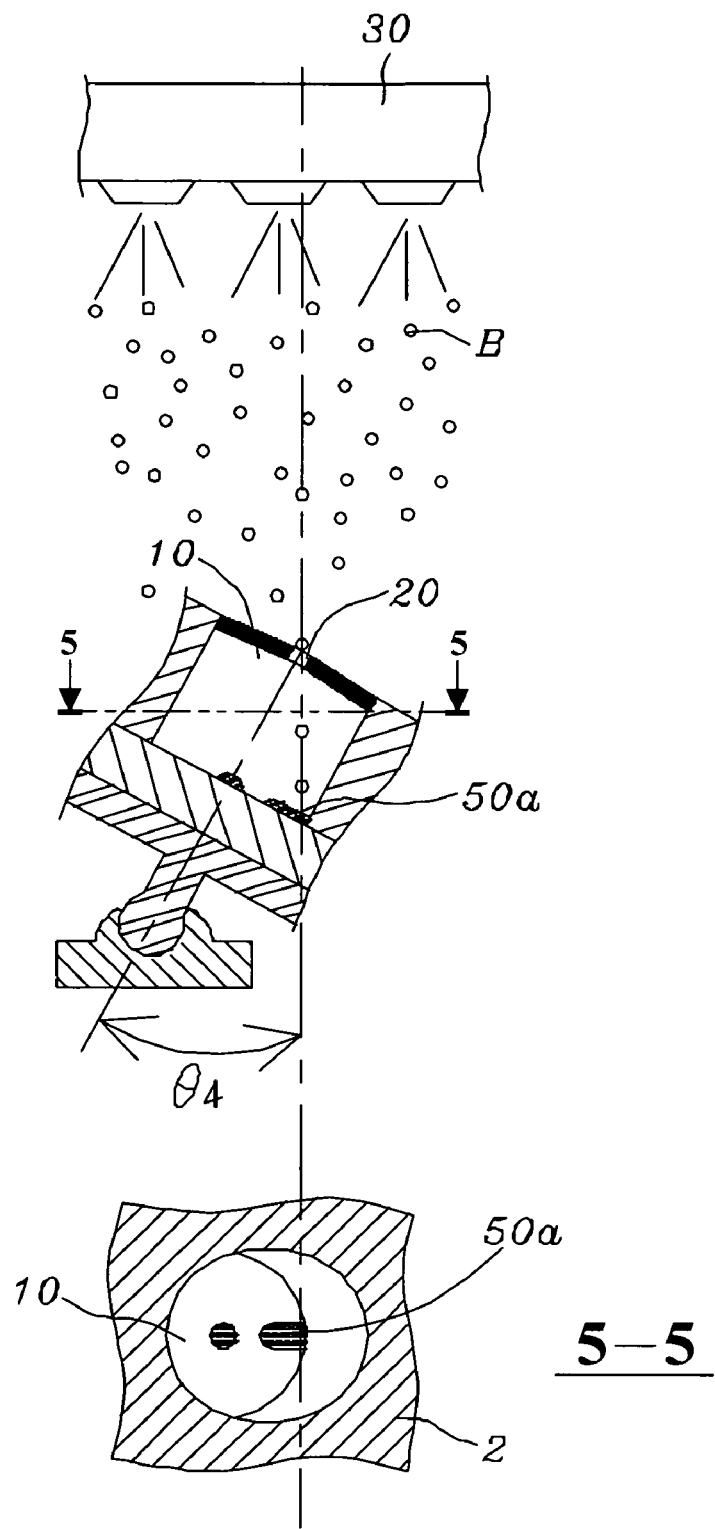
FIG. 14 is the illustrative view showing the fabrication of nano-rod for the drain electrode of the SET on the surface of the substrate according to the present invention.
Figure 15:
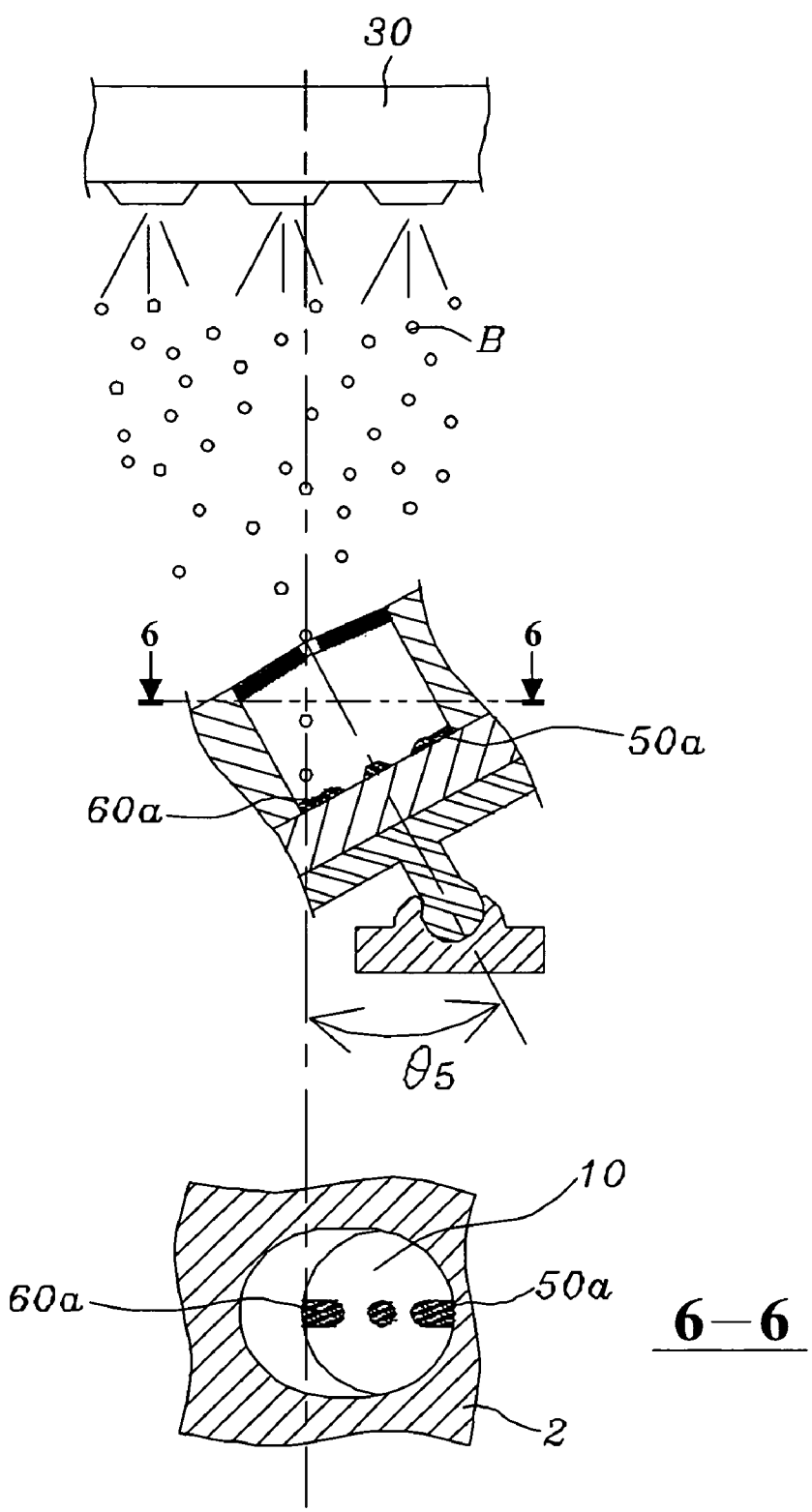
FIG. 15 is the illustrative view showing the fabrication of nano-rod for the source electrode of the SET on the surface of the substrate according to the present invention.
Figure 16:
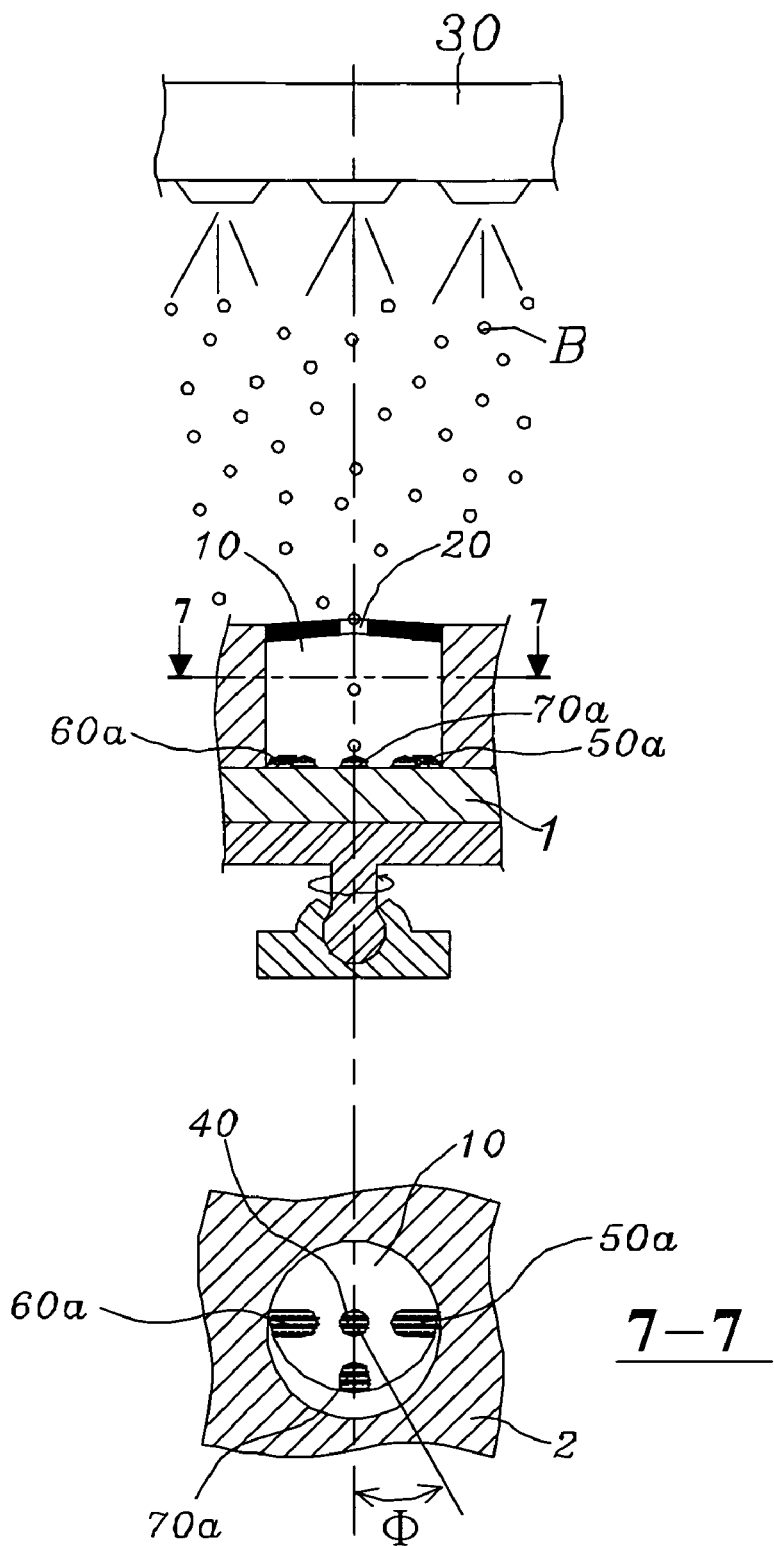
FIG. 16 is the illustrative view showing the fabrication of nano-rod for the gate electrode of the SET on the surface of the substrate according to the present invention.
Figure 17:
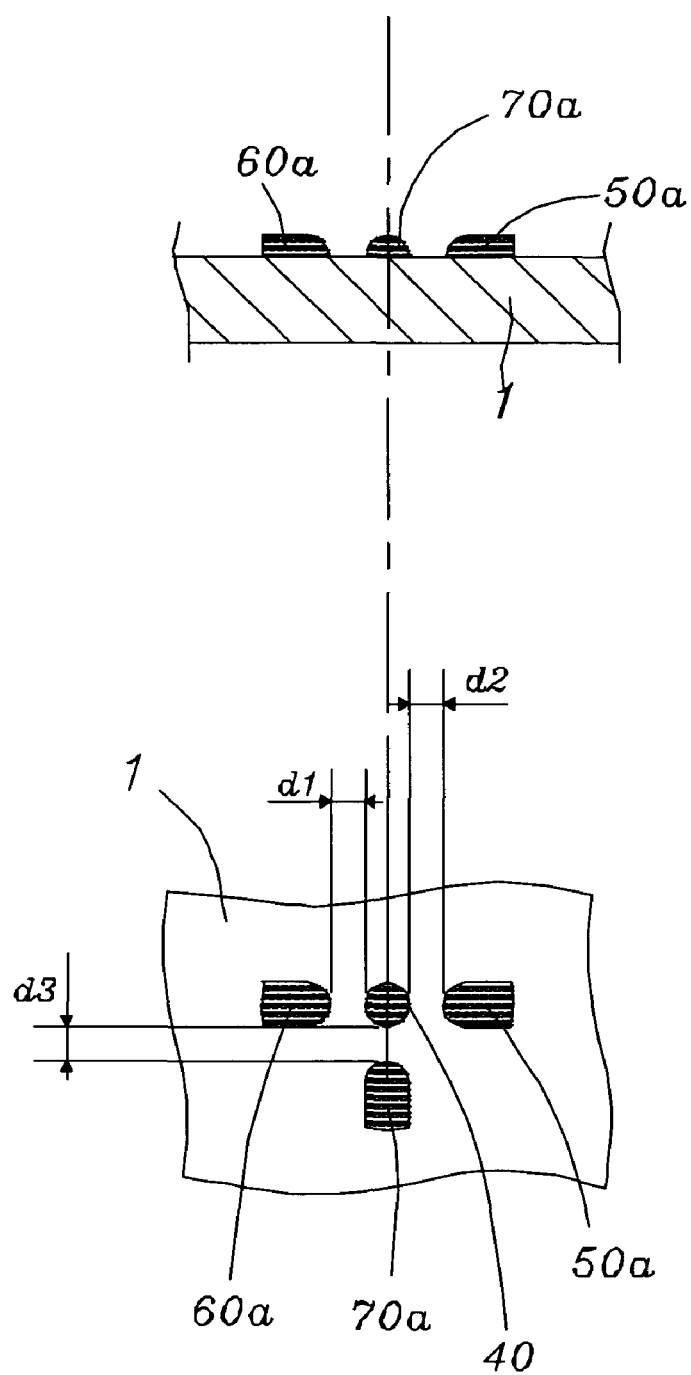
FIG. 17 is the illustrative view showing the completion of nano-quantum-dot for island-electrode, nano-rod for drain-electrode, nano-rod for source-electrode and of nano-rod for gate-electrode of the SET on the surface of the substrate according to the present invention.
Figure 18:
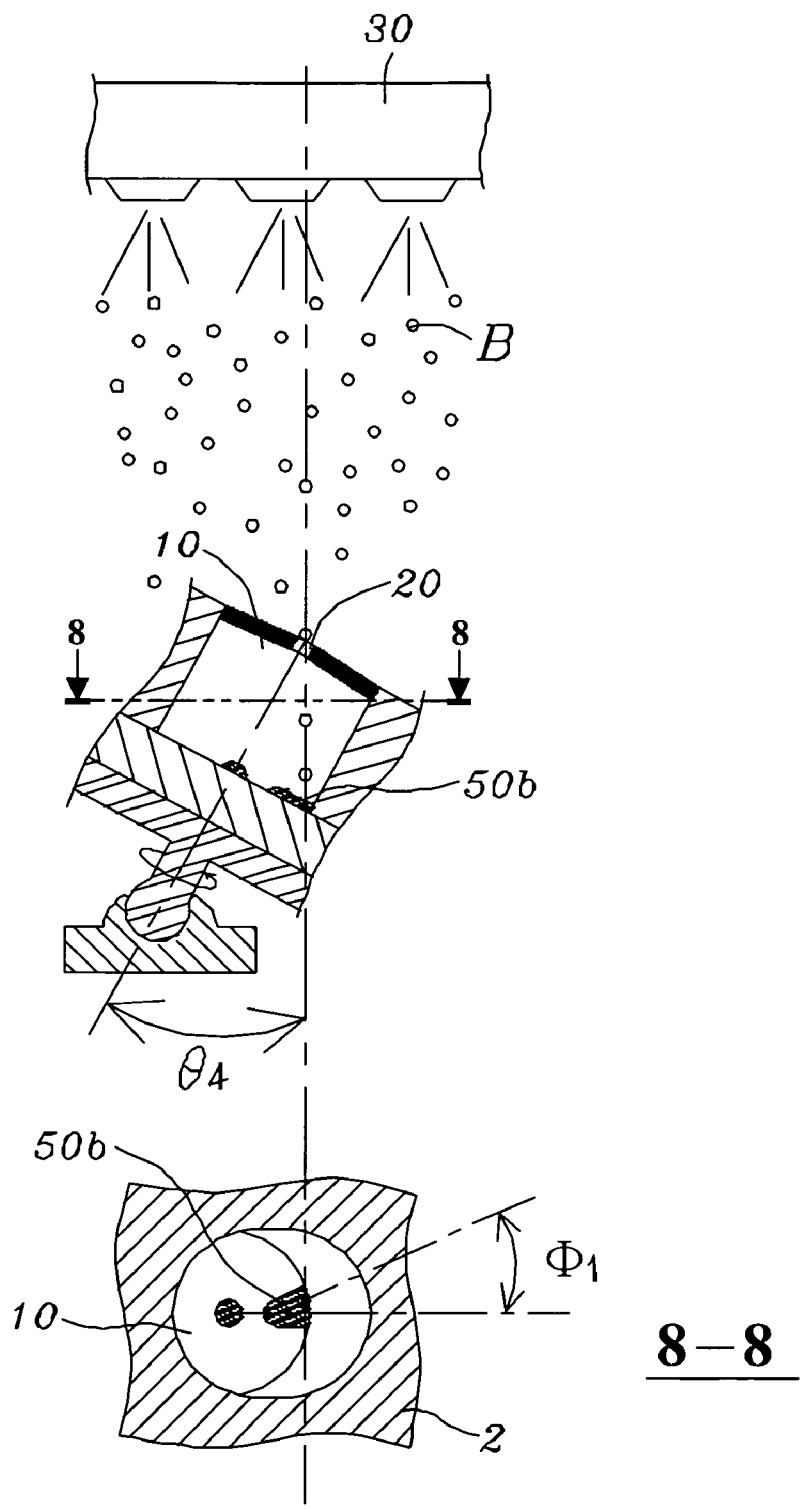
FIG. 18 is the first illustrative operation view showing the fabrication in widening process on the end of nano-rod for the drain-electrode of the SET according to the present invention.
Figure 19:
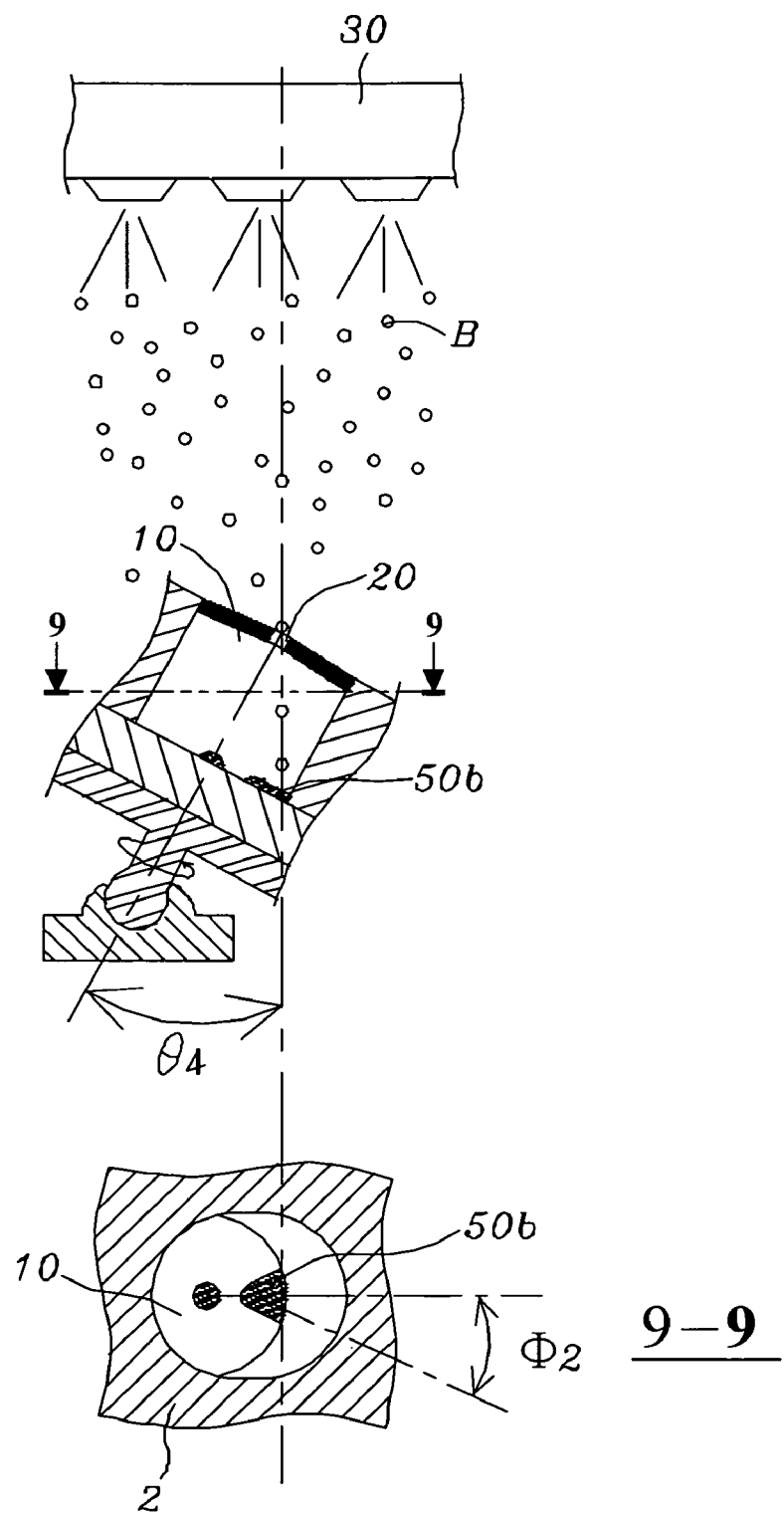
FIG. 19 is the second illustrative operation view showing the fabrication in widening process on the end of nano-rod for the drain-electrode of the SET according to the present invention.
Figure 20:
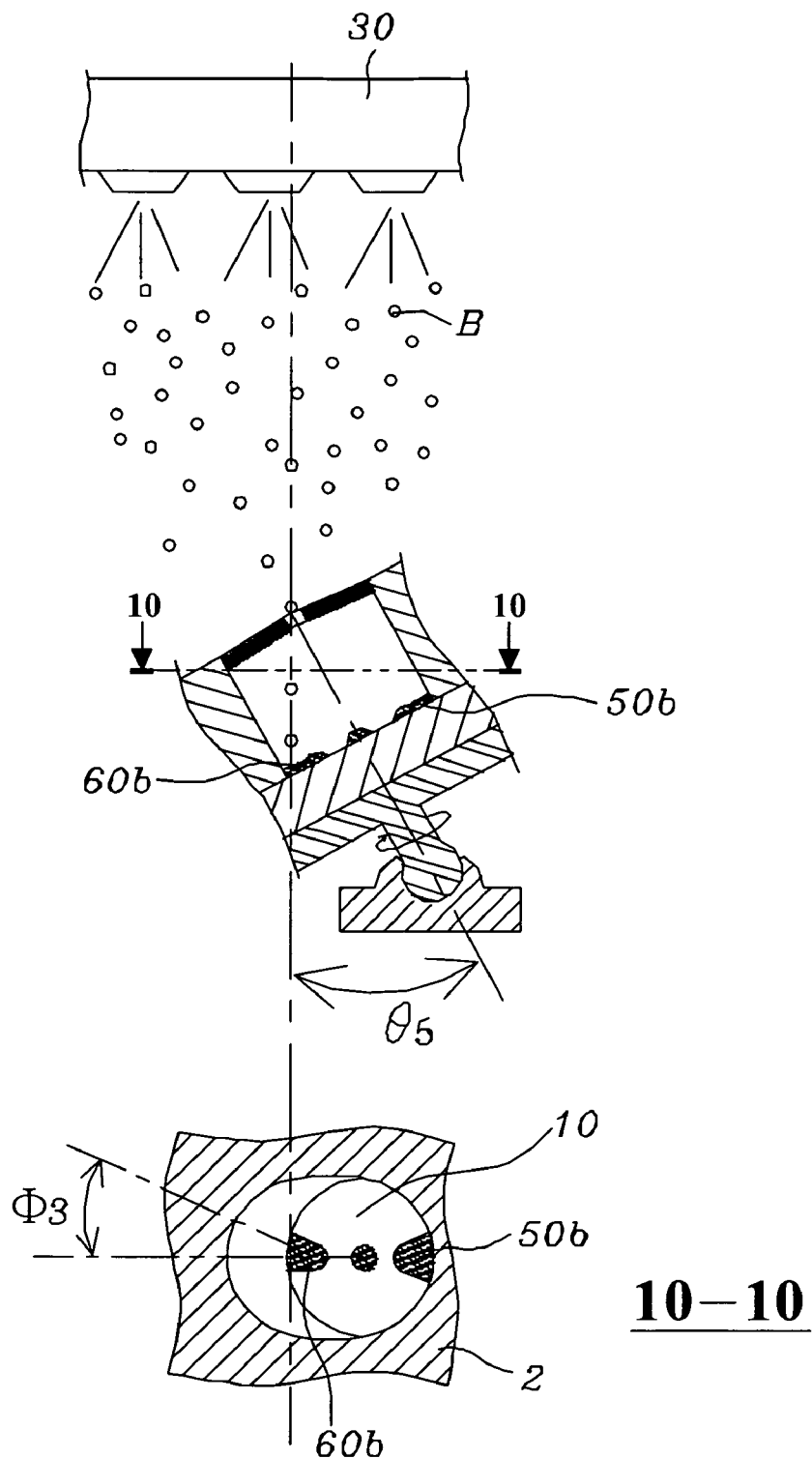
FIG. 20 is the first illustrative operation view showing the fabrication in widening process on the end of nano-rod for the source-electrode of the SET according to the present invention.
Figure 21:
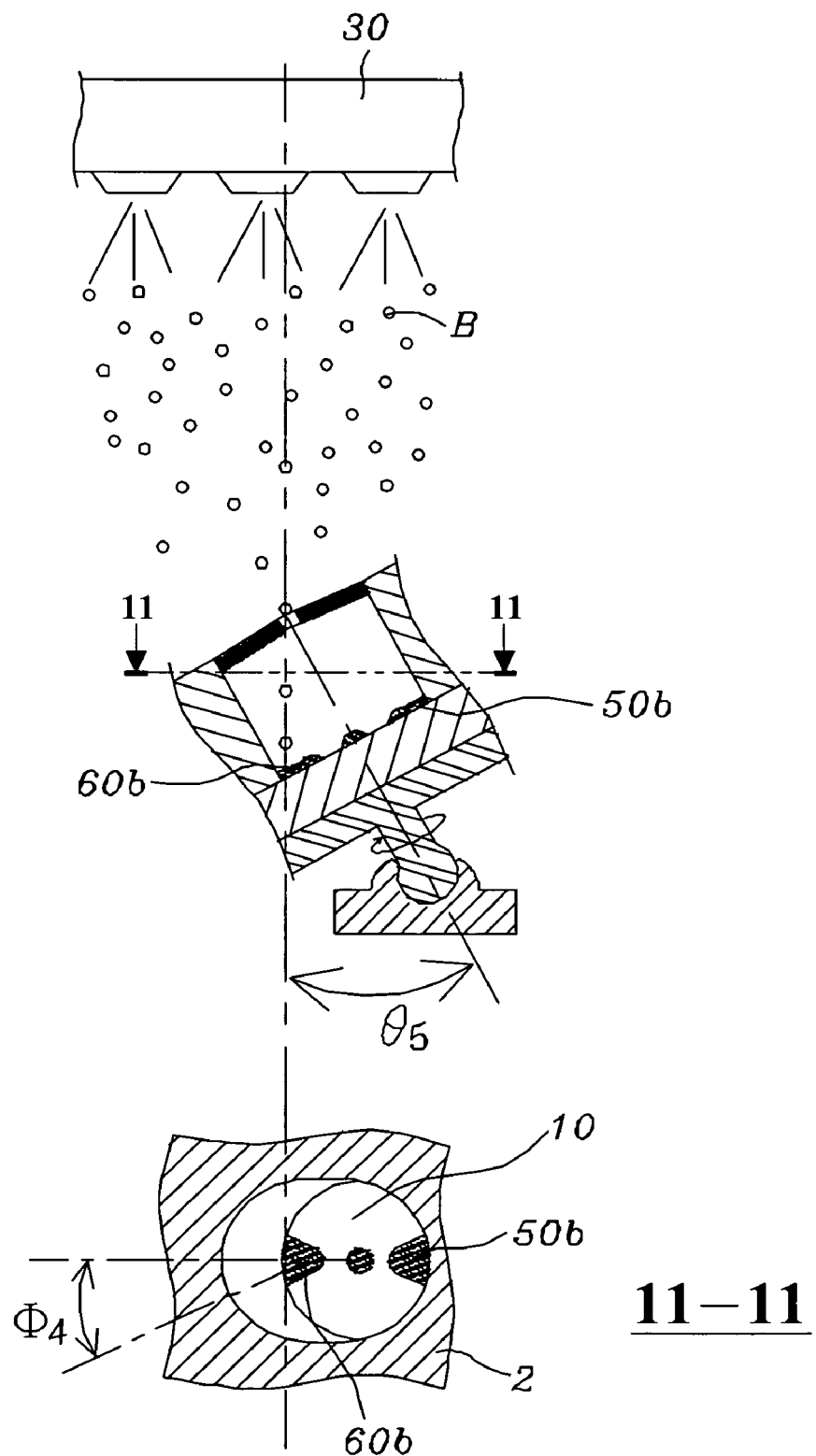
FIG. 21 is the second illustrative operation view showing the fabrication in widening process on the end of nano-rod for the source-electrode of the SET according to the present invention.
Figure 22:
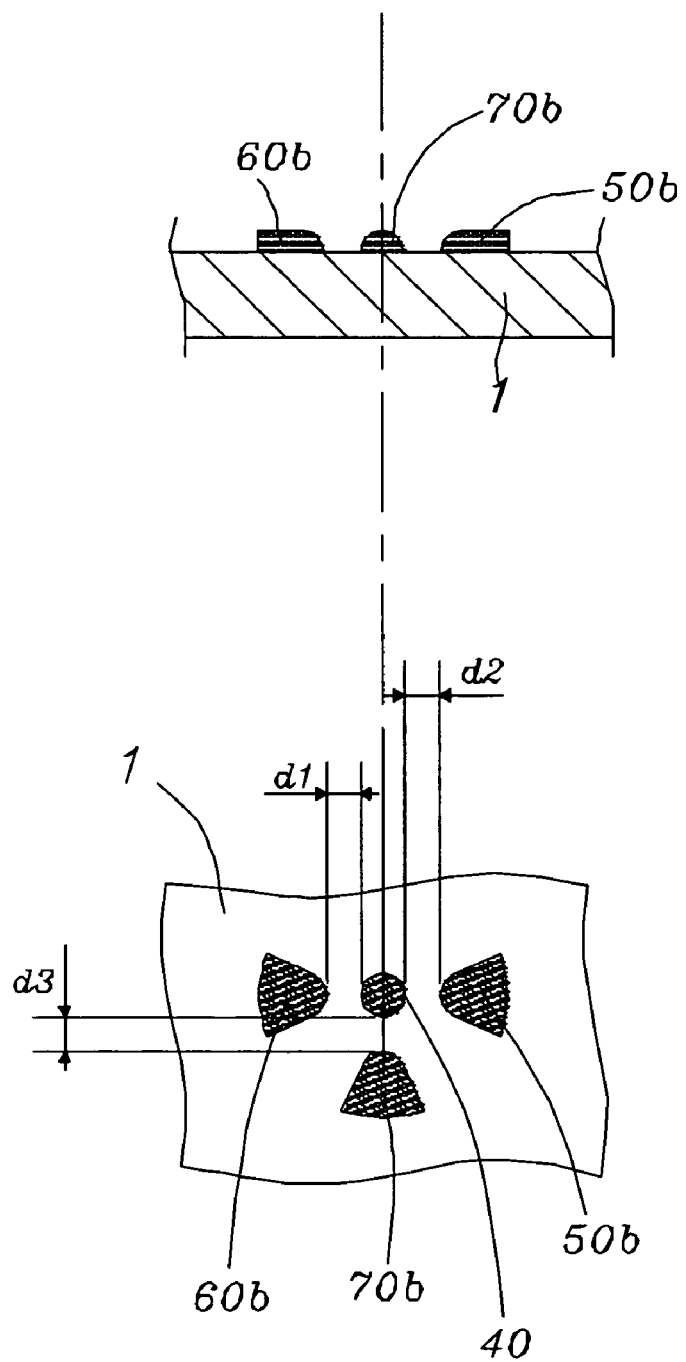
FIG. 22 is the illustrative view showing the completion of widening process on each end of the nano-rod for the drain-electrode, the source-electrode and the gate-electrode of the SET on the surface of the substrate according to the present invention.

Please further refer to FIG. 14 through FIG. 17, in order to enable the drain electrode D nano quantum dot 50 to compatibly connect with other electronic components or conducting wire, the size of which should be expanded or widened by gradually increasing rightwards tilt angle θ4 in foregoing step (c) so that a bar-shaped of drain electrode D nano rod 50a is gradually deposited and formed by letting deposit material B of gas molecular or atom state continuously passing through reduced nano-aperture 20 (as shown in the FIG. 14 and view 5-5 of the FIG. 14); Likewise, the leftwards tilt angle θ5 in the foregoing step (d) can be further gradually increased so that a bar-shaped of source electrode S nano rod 60a is gradually deposited and formed by letting deposit material B of gas molecular or atom state continuously passing through reduced nano-aperture 20 (as shown in the FIG. 15 and view 6-6 of the FIG. 15); For the foregoing step (e), the tilt angle θ can be further gradually increased in coordination with the rotation angle Φ so that a bar-shaped of gate electrode G nano rod 70a is gradually deposited and formed by letting deposit material B of gas molecular or atom state continuously passing through reduced nano-aperture 20 (as shown in the FIG. 16 and view 7-7 of the FIG. 16); Through fabricating process of foregoing steps, the SET (Single Electron Transistor) with compatibility in connection with other electronic components or conducting wire can be successfully obtained.

Please further refer to FIG. 18 through FIG. 22, in order to widen the end of each nano-rod for drain electrode D nano rod 50a, source electrode S nano rod 60a and gate electrode G nano rod 70a respectively, the rotation angles Φ1, Φ2, Φ3 and Φ4 in foregoing steps (c), (d) and (e) can be gradually increased in controllable adjustment manner so that a SET including widened end of each nano-rod in drain electrode D nano rod 50a, source electrode S nano rod 60a and gate electrode G nano rod 70a respectively is successfully obtained.

In conclusion, adopting the fabricating method of Single Electron Transistor (SET) in the present invention, by means of adjusting suitable tilt angle θ, rotation angle Φ and diameter of the reduced nano-aperture, all the position, size, constituent and the density of each nano quantum dot in island electrode I, drain electrode D, source electrode S and gate electrode G can be precisely controlled and fabricated under process of room temperature in compatible manner with current existing nano-lithography so that it becomes very simple and cost-effective in mass production as well as technical breakthrough in the fabricating process and technology of the SET (Single Electron Transistor); Thus, the present invention not only conforms to the industrial application and exploitation but also possesses the essential criteria of patentability of novelty, non-obviousness and practical advancement in practical use.

What is claimed is:

1. A Single Electron Transistor (SET) fabricating employing nano-lithographical technology in a semiconductor process with processing steps comprising:

(a): first depositing a sealing material in a gaseous molecular or atomic state on a top-opening of a nano cylindrical pore formed on a photo-resist layer on a substrate, so that a diameter of said top-opening gradually reduces to become a reduced nano-aperture, whose opening diameter is smaller than said diameter of said top-opening;

(b) maintaining said substrate in a horizontal direction, and aligning an output of the sealing material which is in said gaseous molecular or atomic state to face perpendicularly towards the reduced nano-aperture so that an island electrode nano quantum dot with a same diameter as the reduced nano-aperture is directly deposited at an expected position on a surface of said substrate by means of said sealing material passing through said reduced nano-aperture;

(c) maintaining the output of the sealing material which is in said gaseous molecular or atomic state in a same direction as before, tilting said substrate rightwards into a right tilt angle with the reduced nano-aperture as center, and and depositing a drain electrode nano quantum dot at an expected right position on said island electrode nano quantum dot on the surface of said substrate by the sealing material passing through said reduced nano-aperture again;

(d) maintaining the output of the sealing material in said gaseous molecular or atomic state in the same direction as before, tilting said substrate leftwards into a left tilt angle with the reduced nano-aperture as center, and depositing a source electrode nano quantum dot at an expected left position of said island electrode nano quantum dot on the surface of said substrate by the sealing material passing through said reduced nano-aperture again;

(e) maintaining the output of the sealing material in said gaseous molecular or atomic state in the same direction as before, rotating said substrate clockwise into a rotation angle in coordination with a rotated tilt angle having said reduced nano-aperture as a central axis, and depositing a gate electrode nano quantum dot at an expected front position of said existing island electrode nano quantum dot on the surface of said substrate by the sealing material passing through said reduced nano-aperture again, and (f) by means of solution rinsing or gas etching, removing said nano cylindrical pore in said photo-resist on said substrate, wherein a Single Electron Transistor (SET) including the island electrode nano quantum dot, the drain electrode nano quantum dot, the source electrode nano quantum dot and the gate electrode nano quantum dot with nano-scale is directly fabricated on the surface of said substrate.

2. The SET fabricating method of claim 1, wherein, the right tilt angle in said step (c) is equivalent to the left tilt angle in said step (d), and the third tilt angle in said step (e) is equivalent to said first and second tilt angles.

3. The SET fabricating method of claim 1, wherein, said rotated tilt angle and said rotation angle in said step (e) are determined by a distance between said island electrode nano quantum dot and said gate electrode nano quantum dot.

4. The SET fabricating method of claim 1, wherein, the foregoing procedure of said steps (b), (c), (d) and (e) is interchangeable with flexibility in sequential order.

5. The SET fabricating method of claim 1, wherein, a material for each nano quantum dot of said island electrode nano quantum dot, drain electrode nano quantum dot, source electrode nano quantum dot and gate electrode nano quantum dot is a semiconductor or metal.

6. The SET fabricating method of claim 1, wherein, said deposited material in step (b) is the output of said deposited source device; a collimator is installed between said deposited source device and said reduced nano-aperture so that the moving direction of said deposited material of gas molecule or atom state becomes more coherent; and wherein, the reliability of said nano-structure in smaller size scale formed on the surface of said substrate is enhanced.

7. The SET fabricating method of claim 1, wherein, said tilt angles and said rotation angle in said steps (c), (d) and (e) are gradually increased to fabricate a SET including said island electrode nano quantum dot, a drain electrode nano rod, a source electrode nano rod and a gate electrode nano rod.

8. The SET fabricating method of claim 7, wherein, each end of said drain electrode nano rod, source electrode nano rod and gate electrode nano rod in said steps of (c), (d) and (e) is widened by gradually increasing said rotation angle in a controllable adjustment manner respectively so that a SET having a widened end of each said drain electrode nano rod, source electrode nano rod and gate electrode nano rod is respectively obtained.

* * * * *